(12) United States Patent
Curatolo et al.

(10) Patent No.: US 7,660,142 B2
(45) Date of Patent: Feb. 9, 2010

(54) DEVICE WITH MEMORY AND METHOD OF OPERATING DEVICE

(75) Inventors: Giacomo Curatolo, Dresden (DE); Zeev Cohen, Zichron-Yaakov (IL); Rico Srowik, Dresden (DE)

(73) Assignee: Infineon Technologies Flash GmbH & Co. KG, Dresden (DE)

( * ) Notice: Subject to any disclaimer, the term of this patent is extended or adjusted under 35 U.S.C. 154(b) by 671 days.

(21) Appl. No.: 11/541,393

(22) Filed: Sep. 29, 2006

(65) Prior Publication Data

US 2008/0091753 A1    Apr. 17, 2008

Related U.S. Application Data

(60) Provisional application No. 60/847,761, filed on Sep. 28, 2006.

(51) Int. Cl.
*G11C 17/00* (2006.01)

(52) U.S. Cl. .................. 365/104; 365/201; 365/226

(58) Field of Classification Search .................. 365/104, 365/201, 226, 185.09, 185.03, 189.09, 189.03, 365/185.18, 185.21, 185.22
See application file for complete search history.

(56) References Cited

U.S. PATENT DOCUMENTS

| | | | |
|---|---|---|---|
| 6,785,629 B2 * | 8/2004 | Rickes et al. | 702/118 |
| 2008/0043525 A1 * | 2/2008 | Syzdek et al. | 365/185.2 |

* cited by examiner

*Primary Examiner*—Dang T Nguyen
(74) *Attorney, Agent, or Firm*—Slater & Matsil, L.L.P.

(57) ABSTRACT

A method of operating an electronic device includes storing a first plurality of bits of digital information in a memory using a first number of memory cells in parallel. The first plurality of bits of digital information are for operating the device when operating parameters are not within a nominal range. The method also includes storing a second plurality of bits of digital information in the memory using a second number of memory cells in parallel. The second plurality of bits of digital information are for operating the device when operating parameters are within a nominal range.

19 Claims, 3 Drawing Sheets

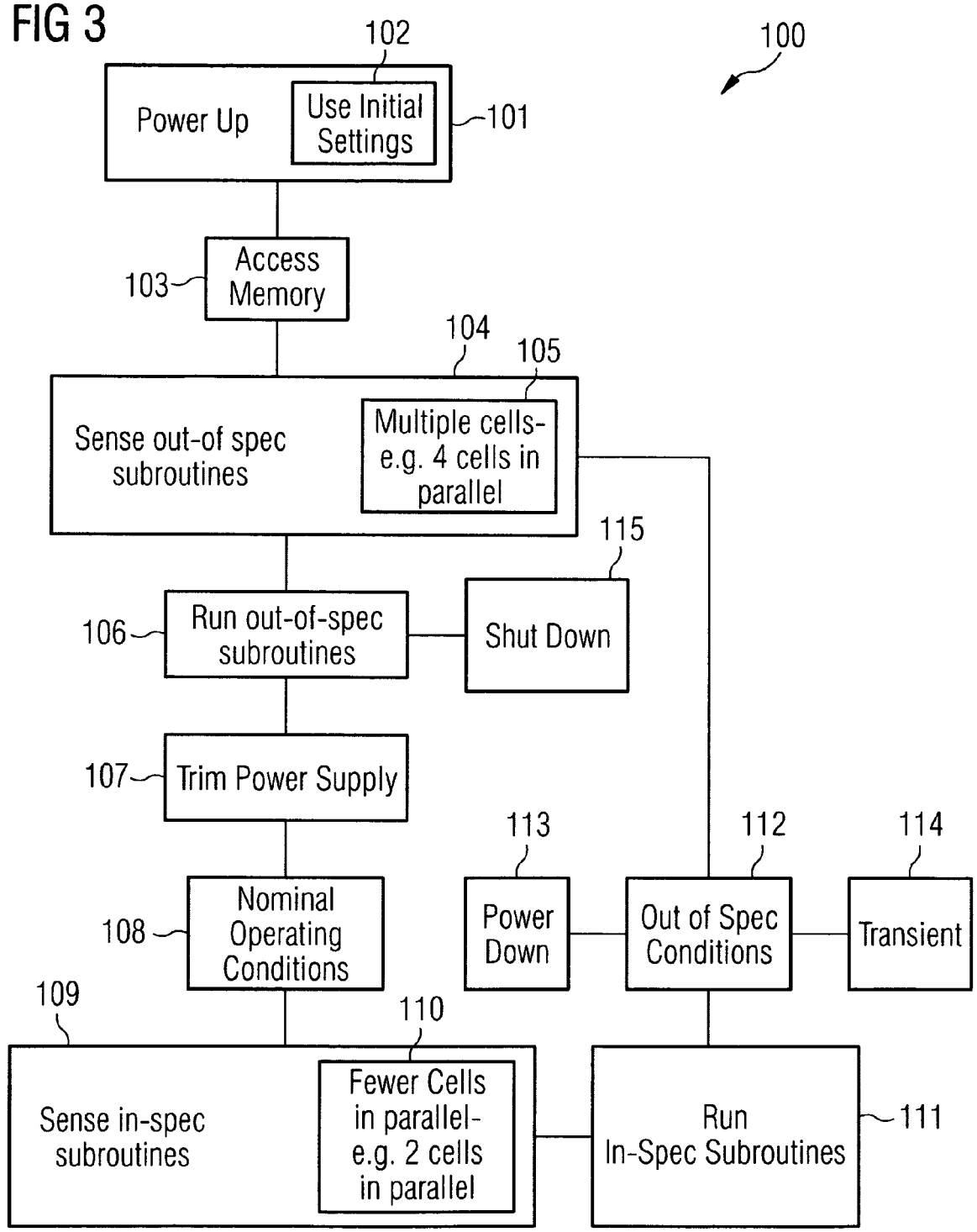
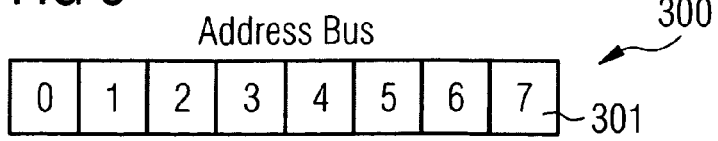

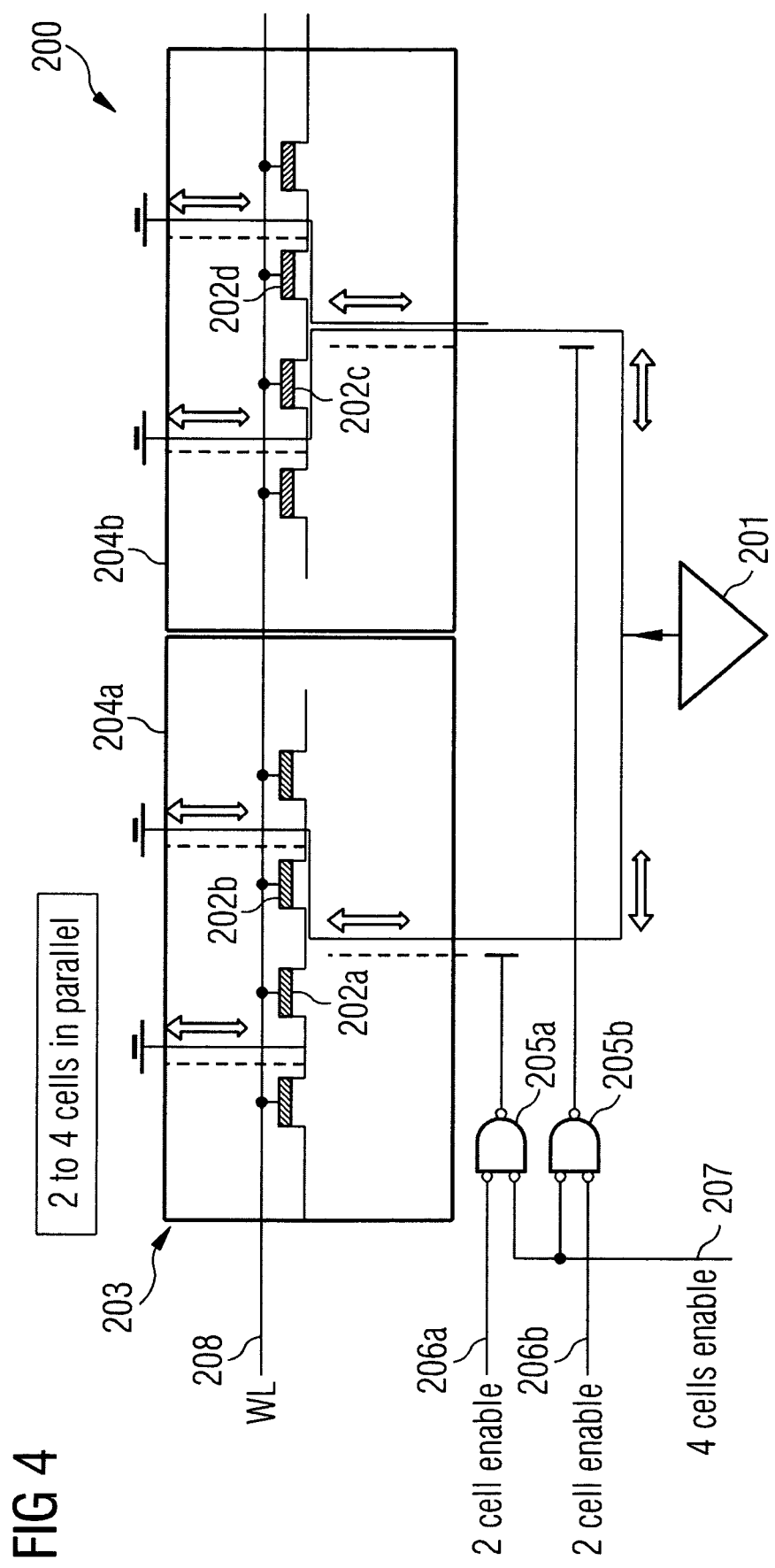

DEVICE WITH MEMORY AND METHOD OF OPERATING DEVICE

This application claims the benefit of provisional application 60/847,761, filed Sep. 28, 2006 and entitled "Device with Memory and Method of Operating Device," which provisional application is incorporated herein by reference.

TECHNICAL FIELD

The invention relates generally to a device with memory and a method of operating the device.

BACKGROUND

A device, for example a microcontroller system, may include at least one memory, for example a read only memory (ROM), for storing information, for example subroutines, for operating the device. The information or subroutines for operating the device may be stored in memory using a plurality of memory cells in parallel, for example four memory cells in parallel, for storing each bit of information. The device may include global bit lines which are shorted together in a multiplexer for sensing the plurality of memory cells in parallel.

DESCRIPTION OF THE DRAWINGS

Features and advantages of the invention may be readily appreciated by persons skilled in the art from the following detailed description of exemplary embodiments thereof, as illustrated in the accompanying drawings, in which:

FIG. 3 illustrates an exemplary embodiment of a method of operating a device;

FIG. 4 illustrates an exemplary embodiment of a memory circuit of an exemplary device; and FIG. 5 illustrates an exemplary embodiment of an address space.

DETAILED DESCRIPTION OF ILLUSTRATIVE EMBODIMENTS

Figure 1:
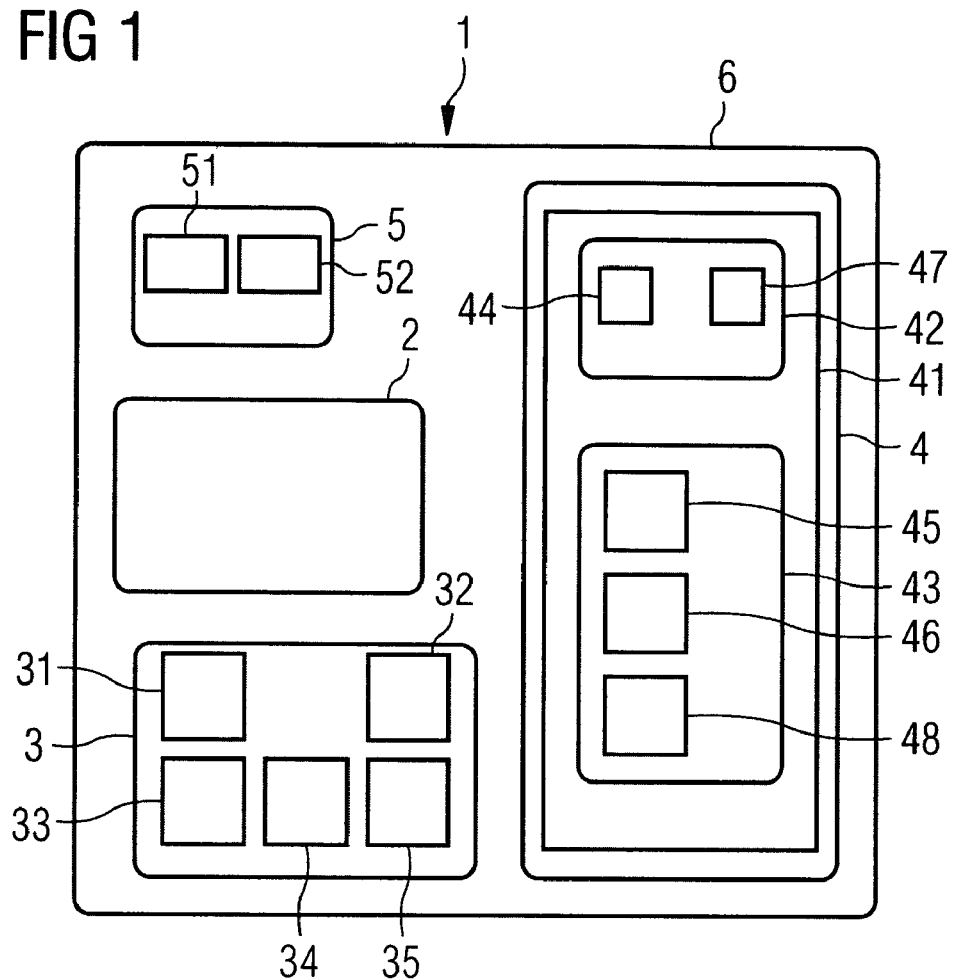
FIG. 1 illustrates a block diagram of an exemplary embodiment of a device.

In the following detailed description and in the several figures of the drawing, like elements are identified with like reference numerals.

FIG. 1 illustrates an exemplary embodiment of a device 1. In an exemplary embodiment, the device 1 may be a microcontroller. In accordance with alternative embodiments, the device 1 may be a Memory Card or a USB key. In an exemplary embodiment, the device 1 may include logic 2, power supply 3, memory 4 (PFROM) for storing information to operate the device and other circuits 5. In an exemplary embodiment, the logic 2, power supply 3, memory 4 and other circuits 5 may be fabricated on one chip 6, e.g., may be monolithically integrated on one die.

In an exemplary embodiment, the power supply 3 may include band gap reference (Bgref) 31, pumps 32, ring oscillator 33, comparator 34 and other circuits 35, for example other analog circuits. In an exemplary embodiment, the other circuits 35 may include a current reference generator, a bias voltage generator, or one or more charge pumps. In an exemplary embodiment, the power supply 3 may include a battery and/or external power supply and power control circuitry including, for example, voltage control circuitry.

In an exemplary embodiment, the other circuits 5 may include circuits for use in a flash memory system including, for example, sense amplifier (SA) 51, decoders 52, wordline drivers or bitline drivers.

In an exemplary embodiment, the memory 4 may include ROM, for example NROM. In alternative embodiments, the memory 4 may include floating gate memory, SONOS memory, TANOS memory, or fuse memory. In an exemplary embodiment, the memory 4 (PFROM) may store information 41 in digital form. In an exemplary embodiment, the information 41 may include, for example, subroutines for operating the microcontroller. In an exemplary embodiment, the information 41 for operating the device 1 may include "out-of-spec" subroutines 42 and "in-spec" subroutines 43. In an exemplary embodiment, the device may include wordlines, bitlines, for example, local bitlines and global bitlines, and switches arranged to select, by address, particular memory cells, memory blocks and/or subroutines to be sensed or read for operating the device.

In an exemplary embodiment, the out-of-spec subroutines 42 may include subroutines for operating during "out-of-spec" conditions. For example, the device may operate when certain parameters are not within nominal, normal or desired operating ranges. In an exemplary embodiment, the out-of-spec subroutines may include subroutines that may run during power up and that may run during transients, for example power spikes or surges, and may include subroutines that may run during shut down. In an exemplary embodiment, the out-of-spec subroutines 42 may include trim 44 and start power supply sequence subroutine 47. In another exemplary embodiment, the out-of-spec subroutines 42 may include decrease clk frequency subroutine. In an exemplary embodiment, the device may continue to run one or more out-of-spec subroutines during in-spec operation, that is, according to this embodiment, the out-of-spec subroutine(s) do not shut down during in-spec operation. In an exemplary embodiment, the device may continue for a short time to sense all four parallel memory cells for the out-of-spec 42 subroutines when in normal operating conditions.

In an exemplary embodiment, the out-of-spec subroutines 42 may include check out-of-spec condition subroutine, or decrease clk frequency subroutine.

In an exemplary embodiment, the in-spec subroutines 43 may include subroutines for operating the device when parameters are within nominal, normal or desired operating ranges. In an exemplary embodiment, the in-spec subroutines 43 may not operate when certain parameters are not within nominal, normal or desired operating ranges. In an exemplary embodiment, the microcontroller subroutines may include subroutines that do not run until the parameters or operating conditions are within nominal, normal or desired ranges. In an exemplary embodiment, the in-spec subroutines 43 may include, for example, built-in self test (BIST) subroutines 45, bias 46, and other subroutines 48. In an exemplary embodiment, the other subroutines 48 may include, for example, array read, program, or erase. In an exemplary embodiment, the in-spec subroutines 43 may include subroutines that do not operate until the voltage and trim are within normal operating conditions, for example, main array sense elements, charge pumps or the access time from some blocks.

In an exemplary embodiment, the parameters that may be used to determine when the out-of-spec subroutines 42 run or when the in-spec subroutines 43 run may be voltage and/or temperature. In an exemplary embodiment, the normal operating ranges for the parameters may be approximately 2.7 V to approximately 3.6 V for voltage, and approximately −40° C. to approximately 120° C. for temperature.

In an exemplary embodiment, device 1 may operate under nominal, normal or desired operating conditions after the power supply 3 has adjusted the parameters, for example the voltage, and trim, to nominal, normal or desired operating ranges. In an exemplary embodiment, the device 1 may operate under other than normal operating conditions when the voltage and/or trim are out of normal, nominal or desired conditions, for example, during start up, shut down or during a transient caused by a spike in power, for example during pump sequences or during sensing time.

Figure 2:
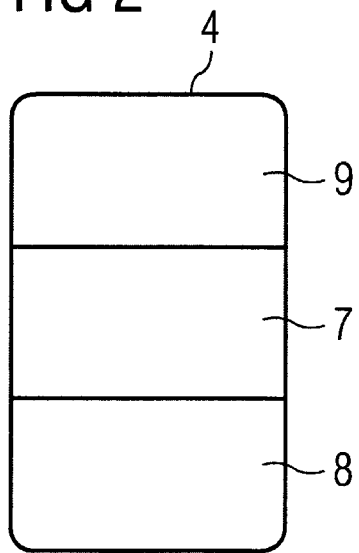
FIG. 2 illustrates a block diagram of an exemplary embodiment of a memory.

FIG. 2 illustrates an exemplary embodiment of a memory 4. In an exemplary embodiment, a portion 9 of the memory 4 may be for storing information 41 (FIG. 1), for example subroutines, for operating a device 1 (FIG. 1). In an exemplary embodiment, a portion 7 of the memory 4 may be dedicated to storing the out-of-spec subroutines 42 (FIG. 1). In an exemplary embodiment, a remaining portion 8 of the memory may be dedicated to storing the in-spec subroutines 43 (FIG. 1).

In an exemplary embodiment, the memory 4 may have a surface area and or data capacity. In an exemplary embodiment, the surface area and data capacity may be approximately linearly related. In an exemplary embodiment, the memory 4 may have a physical surface area or data capacity C. In an exemplary embodiment, the portion 7 for storing out-of-spec subroutines 42 (FIG. 1) may have a surface area or data capacity A and the portion 8 for storing in-spec subroutines 43 (FIG. 1) may have a surface area or data capacity B. In an exemplary embodiment, the sum of the areas or data capacities A plus B may be less than equal to the area or data capacity C.

In an exemplary embodiment, the physical space used to store a particular set of in-spec subroutines 43 (FIG. 1) may depend on the number of memory cells being used in parallel for each bit of information related to those subroutines. For example, using four memory cells in parallel may use about twice as much physical space than using two memory cells. Since the advantage of using more memory cells in parallel may be less for in-spec subroutines 43 (FIG. 1) than for out-of-spec subroutines 42 (FIG. 1), the in-spec subroutines 43 (FIG. 1) may be stored using fewer memory cells in parallel than are the out-of-spec subroutines 42 (FIG. 1). For a given memory with a given physical space, using fewer memory cells in parallel for storing information for in-spec subroutines 43 (FIG. 1) may provide extra available space for additional subroutines or additional information in more complex or larger subroutines for the same available space.

In an exemplary embodiment, the out-of-spec memory, for example ROM, space may be less than the entire memory space. In an exemplary embodiment, for example, the out-of-spec memory space may be about 36 words. In an exemplary embodiment, the entire memory space may be about 4K words. In an exemplary embodiment, the amount of memory or ROM space dedicated to out-of-spec subroutines 42 (FIG. 1) may be less than about one percent of the total space dedicated to memory. In an exemplary embodiment, using fewer memory cells for the subroutines stored in the in-spec subroutine space may increase the available area of memory. The increased memory or ROM area or data capacity may permit more efficient use of chip space. In an exemplary embodiment, using half as many memory cells to store in-spec subroutines 43 (FIG. 1) as opposed to out-of-spec subroutines 42 (FIG. 1) may nearly double the amount of space available. In an exemplary embodiment, this space savings may permit using less chip space for a given application. In an exemplary embodiment, the chip space may be reduced, the space dedicated to memory may be reduced, or the memory may store more complex algorithms or additional BIST instructions.

FIG. 3 illustrates an exemplary embodiment of a method 100 of operating a device 1 (FIG. 1). In an exemplary embodiment, the device may be powered up 101. During power up, the device may use initial settings 102. In an exemplary embodiment, the initial settings 102 may include default settings and may, for example, be hard-wired. In an exemplary embodiment, this may mean that the accuracy of analog blocks (e.g., Bgref, pumps) may not be at desired levels. In an exemplary embodiment, this may be because the voltage levels are untrimmed. In an exemplary embodiment, the device may induce strong signal noise within the system during power up. In an exemplary embodiment, the voltage level detection may not be accurate during power up. In an exemplary embodiment, this may be because the regulators and Bgref circuits may use a default value, which is provided, for example, by hard wiring (e.g., fuses or metal option). In an exemplary embodiment, this may cause the device to operate out of spec, or with parameters outside of nominal, normal or desired operating ranges.

In an exemplary embodiment, the device 1 (FIG. 1) accesses 103 a memory 4 (FIG. 1). In an exemplary embodiment, a sense amplifier senses 104 out-of-spec subroutines 42 (FIG. 1). In an exemplary embodiment, sensing 104 out-of-spec subroutines 42 (FIG. 1) may include sensing 105 multiple memory cells in parallel, for example four memory cells in parallel. In an exemplary embodiment, the out-of-spec subroutines 42 (FIG. 1) may be the first block of memory 4 (FIG. 1) that starts working. In an exemplary embodiment, the out-of-spec subroutines 42 (FIG. 1) may include a trim update subroutine and a start power supply sequence subroutine.

In an exemplary embodiment, before reaching 108 nominal or normal, in-spec operating conditions, the device 1 and memory 4 (FIG. 1) may operate under a wider range of voltage levels than the voltage range specified as nominal operating conditions for the device. In an exemplary embodiment, in order to compensate for the out-of-spec conditions, the out-of-spec subroutines 42 (FIG. 1) may be stored using a plurality of memory cells in parallel for each bit of information stored. In an exemplary embodiment, the out-of-spec subroutines 42 (FIG. 1) may be stored in memory 4 using more cells in parallel than do those portions of the memory used for storing other, in-spec subroutines 43 (FIG. 1). In an exemplary embodiment, the out-of-spec subroutines 42 (FIG. 1) may be stored, for example, using four memory cells in parallel for each bit of information stored and the in-spec subroutines 43 (FIG. 1) may be stored using, for example, two memory cells in parallel for each bit of information stored.

In an exemplary embodiment, the device 1 (FIG. 1) may run 106 the out-of-spec subroutines. In an exemplary embodiment, the power supply may trim 107 the voltage supply. In an exemplary embodiment, the device may reach 108 nominal or normal operating conditions.

In an exemplary embodiment, upon or after reaching 108 the nominal, normal or desired operating conditions, the device may switch from sensing a larger number of cells in parallel, for example four cells in parallel, to sensing a smaller number of cells in parallel, for example two cells in parallel. In an exemplary embodiment, the device may switch from four cells in parallel to two cells in parallel by increasing the signal TST_LESS2BITS to pass the new address bit to the logic block. In an exemplary embodiment, after increasing the signal TST_LESS2BITS, the device may operate sensing only two cells in parallel.

In an exemplary embodiment, the sense amplifier may sense 109 in-spec subroutines 43 (FIG. 1). In an exemplary embodiment, the device may sense 109 in-spec subroutines after reaching 108 nominal or normal operating conditions. In an exemplary embodiment, sensing 109 in-spec subroutines 43 (FIG. 1) may include sensing 110 fewer memory cells in parallel than are sensed when sensing 104 out-of-spec subroutines 42 (FIG. 1), for example, using two memory cells in parallel. In an exemplary embodiment, using fewer memory cells in parallel for in-spec subroutines 43 (FIG. 1) than for out-of-spec subroutines 42 (FIG. 1) may provide additional memory space in memory, in comparison with storing the in-spec subroutines 43 (FIG. 1) and out-of-spec subroutines 42 (FIG. 1) with the same number of multiple memory cells in parallel as the out-of-spec subroutines 42 (FIG. 1). In an exemplary embodiment, the additional memory space may be used to store other or additional subroutines, for example BIST and/or more sophisticated algorithms for the device.

In an exemplary embodiment, the device may run 111 in-spec subroutines. In an exemplary embodiment, the device may continue to run 111 in-spec subroutines until the device reaches 112 out-of-spec conditions. In an exemplary embodiment, reaching 112 out-of-spec conditions may occur as a result of powering down 113 or a transient 114. In an exemplary embodiment, a transient 114 may be a power surge.

In an exemplary embodiment, the device may sense 104 out-of-spec subroutines 42 (FIG. 1) and run 106 out-of-spec subroutines 42 (FIG. 1). In an exemplary embodiment, the device may continue to run 106 out-of-spec subroutines 42 (FIG. 1) until the device shuts down 115 or until the device reaches nominal or normal operating conditions.

In an exemplary embodiment, the out-of-spec subroutines 42 (FIG. 1) may include subroutines that protect the device during shutdown. In an exemplary embodiment, the out-of-spec subroutines 42 (FIG. 1) may include subroutines that restore the nominal condition and ensure that the same flags and pointers are provided for the uC and code.

In an exemplary embodiment, the device may run for a time after a power surge or spike. In an exemplary embodiment, the out-of-spec subroutines 42 (FIG. 1) may run 106 during the period of time after the surge and before reaching nominal, normal operating conditions, for example after the voltage and trim have stabilized. In an exemplary embodiment, the device may again reach 108 nominal operating conditions and operate in-spec subroutines.

In an exemplary embodiment, storing the in-spec subroutines 43 (FIG. 1) using fewer memory cells than the out-of-spec subroutines 42 (FIG. 1) may increase the memory space available for performing other operations, for example for performing a built-in self test (BIST) and/or more sophisticated algorithms for the device. In an exemplary embodiment, the memory data capacity, assuming the same number of memory cells, may substantially double when using two cells in parallel as opposed to four cells in parallel for in-spec subroutines. In one embodiment of the invention, a sophisticated algorithm for the device is a scan test algorithm for detecting defects in one or more memory cells.

FIG. 4 illustrates an exemplary embodiment of a memory circuit 200 for a device 1 (FIG. 1). In an exemplary embodiment, the memory circuit 200 may include a sense amplifier 201. In an exemplary embodiment, the sense amplifier may sense memory cells 202*a-d* arranged in an array 203 of memory cells. In an exemplary embodiment, the array 203 may include at least two column halves 204*a* and *b* (col_half) per time and/or sense amplifier. In an exemplary embodiment, the memory cells 202 may be used to store information, for example out-of-spec subroutines 42 or in-spec subroutines 43 (FIG. 1).

In an exemplary embodiment, when the memory cells 202*a-d* store information storing out-of-spec subroutines, sensing 104 (FIG. 3) the out-of-spec subroutines 42 (FIG. 1) may include providing an enable four cells signal 207 to a pair of logic gates 205*a* and 205*b* for selecting to sense the four memory cells 202*a-d*.

In an exemplary embodiment, where the memory cells 202*a-d* store in-spec subroutines 43 (FIG. 1), sensing 109 (FIG. 3) the in-spec subroutines 43 (FIG. 1) may include providing an enable two cells signal 206*a* or 206*b* to the logic gates 205*a* and/or 205*b* to select memory cells in column halves 204*a* and/or 204*b*.

In an exemplary embodiment, the power consumption to charge the bitlines may be reduced by half during normal functional range because of the use of only two (in an alternative embodiment of the invention only one) global bitlines (GBL) instead of four (in an alternative embodiment of the invention instead of two) GBL.

In an exemplary embodiment, sensing fewer cells in parallel may decrease a charge sharing effect due to the pre-charge of a drain side of a cell not being fully accomplished. In an exemplary embodiment, this may be because of the decreased global bit line (GBL) total cap, in other words, the capacitance of the global bitline, which may mean that the pre-charge phase may be shorter. In an exemplary embodiment, the sense amplifier cap, in other words, the capacitance inside the sense amplifier may be decreased to speed up the sensing phase even against total cell current.

In an exemplary embodiment, the capacitance GBL+LBL may be approximately equal to 205 fF. In an exemplary embodiment, it may be charged to about 1.1 V and may have, for example, a clock cycle of about 50 ns. In an exemplary embodiment, this may result in an average reduction in current consumption of about 72 μA (205 fF*16(GBL+LBL)*1.1 V (bitline voltage)/50 ns (clk cycle)=72 μA).

In an exemplary embodiment, the memory cells and circuitry may be arranged so that individual cells may either be addressed as so that one number of cells, for example two cells, may be read in parallel or so that a higher number of cells, for example four, may be read in parallel. In an exemplary embodiment, the memory circuit 200 may include a wordline 208 for selecting one column half (col_half) per time without shorting two global bit lines (GBL) inside a multiplexer.

FIG. 5 illustrates an exemplary embodiment of an address space 300 for information stored in memory 4. In an exemplary embodiment, the address space 300 may include one bit 301 indicative of sensing either the smaller number of memory cells in parallel, for example to sense 109 (FIG. 3) in-spec subroutines 43 (FIG. 1), or for selecting a greater number of memory cells in parallel, for example to sense 104 (FIG. 3) out-of-spec subroutines 42 (FIG. 1). In an exemplary embodiment, the bit 301 may be indicative of sensing either two memory cells in parallel or four memory cells in parallel. In an exemplary embodiment, for example, a seventh bit may be used for indicating whether to sense more or fewer cells (for example four or two cells) in parallel.

In an exemplary embodiment, a system that previously sensed four memory cells in parallel may be modified by adding one bit to the address space of the microcomputer to have an additional bit. In an exemplary embodiment, this may include increasing the address space from 0 to 11 to 0 to 12.

Although the foregoing has been a description and illustration of specific embodiments of the invention, various modifications and changes thereto can be made by persons skilled in the art without departing from the scope and spirit of the disclosure.

What is claimed is:

1. An electronic device comprising:
a power supply, the power supply providing power within a first range of parameters during a first period of time and providing power within a second range of parameters during a second period of time;
a logic portion powered by the power supply, the logic portion operable to run subroutines provided by a memory;
a memory storing bits of information;
a first plurality of bits of information stored in the memory and to be run during the first period of time; and
a second plurality of bits of information stored in the memory and to be run during the second period of time;
each of the first plurality of bits of information being sensed using a first number of memory cells in parallel and each of the second plurality of bits of information being sensed using a second number of memory cells in parallel, the first number of memory cells being greater than the second number of memory cells.

2. The electronic device in accordance with claim 1, wherein the first number of memory cells is four and wherein the second number of memory cells is two.

3. The electronic device in accordance with claim 1, wherein the first range of parameters corresponds to non-nominal or non-normal operating conditions and wherein the second range of parameters corresponds to nominal or normal operating conditions.

4. The electronic device in accordance with claim 1, wherein the first range of parameters comprises out-of-spec parameters and the second range of parameters comprises in-spec parameters.

5. The electronic device in accordance with claim 1, wherein the first range of parameters comprises a voltage being within a range of 2.7 V to 3.6 V.

6. The electronic device in accordance with claim 1, wherein a first set of subroutines comprises at least one of trim, start-up sequence, check out-of-spec condition, or decrease clock frequency.

7. The electronic device in accordance with claim 6, wherein a second set of subroutines comprises at least one of array read, program or erase.

8. The electronic device in accordance with claim 7, wherein the first set of subroutines is sensed using the first number of memory cells per cycle during the first period of time and the second set of subroutines is sensed using the second number of memory cells per cycle during the second period of time.

9. The electronic device in accordance with claim 8, wherein the first set of subroutines is sensed using four memory cells per cycle during the first period of time and wherein the second set of subroutines is sensed using two memory cells per cycle during the second period of time.

10. The electronic device in accordance with claim 1, wherein the first plurality of bits of information are stored in memory using a first number of memory cells in parallel and wherein the second plurality of bits of information are stored in memory using a second number of memory cells in parallel, wherein the first number of memory cells is greater than the second number of memory cells.

11. The electronic device in accordance with claim 10, wherein the first number of memory cells is four and the second number of memory cells is two.

12. A method of operating an electronic device, comprising:
sensing a first plurality of bits of information from a memory using a first number of memory cells in parallel when operating parameters are not within a nominal range; and
sensing a second plurality of bits of information from memory using a second number of memory cells in parallel when operating parameters are within the nominal range, wherein the first number of memory cells is more than the second number of memory cells.

13. The method of operating an electronic device in accordance with claim 12, wherein the first plurality of bits of information comprises out-of-spec subroutines and the second plurality of bits of information comprises in-spec subroutines.

14. The method of operating an electronic device in accordance with claim 12, wherein the first plurality of bits of information comprise at least one of a trim subroutine or a start-up routine subroutine and wherein the second plurality of bits of information comprise at least one of an array read subroutine, a program subroutine, or an erase subroutine.

15. The method of operating an electronic device in accordance with claim 12, further comprising:
storing the first plurality of bits of information in the memory using the first number of memory cells in parallel for each bit; and
storing the second plurality of bits of information in the memory using the second number of memory cells in parallel for each bit.

16. The method of operating an electronic device in accordance with claim 15, wherein the first number of memory cells is four and the second number of memory cells is two.

17. A method of operating an electronic device, comprising:
storing a first plurality of bits of digital information in a memory using a first number of memory cells in parallel, wherein the first plurality of bits of digital information are for operating the device when operating parameters are not within a nominal range; and
storing a second plurality of bits of digital information in the memory using a second number of memory cells in parallel, wherein the second plurality of bits of digital information are for operating the device when operating parameters are within the nominal range.

18. The method of operating an electronic device in accordance with claim 17, wherein the first number of memory cells in parallel comprises four memory cells in parallel and the second number of memory cells in parallel comprises two memory cells in parallel.

19. The method of operating an electronic device in accordance with claim 17, wherein the first plurality of bits of digital information comprise out-of-spec subroutines and the second plurality of bits of digital information comprise in-spec subroutines.

* * * * *